United States Patent [19]

Patel et al.

[11] Patent Number: 5,430,745
[45] Date of Patent: Jul. 4, 1995

[54] PREJUDGING CURRENT STATE IN A DECODER FOR CODED SIGNAL PROCESSING CHANNELS

[75] Inventors: Arvind M. Patel; Robert A. Rutledge; Bum S. So, all of San Jose, Calif.

[73] Assignee: International Business Machines Corporation, Armonk, N.Y.

[21] Appl. No.: 198,202

[22] Filed: Feb. 17, 1994

[51] Int. Cl.[6] .............................................. G06F 11/10
[52] U.S. Cl. ............................................ 371/43; 341/59
[58] Field of Search .................... 371/43, 55, 56, 57.2, 371/65; 341/58, 59, 72, 94

[56] References Cited

U.S. PATENT DOCUMENTS

| | | | |
|---|---|---|---|
| 4,945,538 | 7/1990 | Patel | 371/43 |
| 5,243,605 | 9/1993 | Lekmine et al. | 371/43 |
| 5,282,216 | 1/1994 | Patel et al. | 371/43 |
| 5,291,500 | 3/1994 | Patel et al. | 371/65 |
| 5,311,178 | 5/1994 | Pan et al. | 341/59 |

*Primary Examiner*—Paul P. Gordon
*Assistant Examiner*—Steven R. Garland
*Attorney, Agent, or Firm*—Henry E. Otto, Jr.

[57] ABSTRACT

Decoder for processing digital sample values corresponding to an incoming read signal representative of coded binary data. Functional expressions of digital sample values are precomputed for a preselected number of sample values ahead of a current sample value. To provide binary decision outputs, preselected functional expressions are compared against binary representations of corresponding thresholds that are conditioned by the sign of a selected functional expression comprising at least one preselected digital sample value. These outputs, the sign of the selected functional expression, the current value and previous value of decoded data, and the current value of detected phase, are all used to determine the next value of decoded data and next value of detected phase. These next values become the current values of decoded data and detected phase for the next clock cycle. The binary representations input to the comparators and the binary decision outputs of the comparators are inverted only if the selected functional expression has a preselected sign.

11 Claims, 3 Drawing Sheets

PREJUDGING CURRENT STATE IN A DECODER FOR CODED SIGNAL PROCESSING CHANNELS

FIELD OF THE INVENTION

This invention relates to an improved coded signal processing channel embodying apparatus for prejudging or pre-estimating the current state of the channel to enable a reduction in hardware and, hence in power and circuitry, without sacrificing channel data rate.

BACKGROUND OF THE INVENTION

The following commonly-assigned prior art references are considered to be the most pertinent to the present invention:
1. U.S. Pat. No. 4,945,538, granted Jul. 31, 1990, entitled "Method and Apparatus for Processing Sample Values in a Coded Signal Processing Channel."
2. U.S. Pat. No. 5,282,216, granted Jan. 25, 1994, entitled "High Data Rate Decoding Method for Coded Signal Processing Channel."
3. Application U.S. Ser. No. 07/526,878, filed May 22, 1990, now U.S. Pat. No. 5,291,500 entitled "Eight-Sample Look-Ahead for Coded Signal Processing Channels."

Each of the references 1-3 discloses a (1,7) maximum likelihood (ML) coded signal processing channel comprising a (1,7) ML decoder that uses (i) a known current state of the channel, denoted by the three most recent bits ($a_0$, $b_0$, $c_0$) of the (1,7) coded sequences in NRZ notation, and (ii) five or more digital sample values, denoted $y_0, y_1 \ldots y_n$, derived from an analog read signal to determine the next state of the channel, denoted ($a_1$, $b_1$, $c_1$).

There are four states, (000, 100, 111, 011) for which decisions are required. Part of the decision process is to compute the values of certain linear functions of the digital sample values and compare the result to a boundary threshold value, which depends on the current state of the channel, using a hardware comparator. For example, one such comparison is:

$$[y_0 + 2y_1 + y_2] \leq K(a_0, b_0, c_0)$$

where $K(a_0, b_0, c_0)$ is a predetermined state-dependent constant.

Since this comparison depends on the current state, either the current state must be known prior to beginning the comparison, or, alternatively, all four possible comparisons must be made; and then later, when ($a_0$, $b_0$, $c_0$) is known, only the correct comparator output must be used. If the comparison is delayed until the state ($a_0$, $b_0$, $c_0$) is known, the decoding process is slowed down, and the data rate of the channel is limited. On the other hand, if the comparisons are performed for all four possible states, four times as much hardware and four times as much power will be required than is really needed.

In References 1-3, the detected phase $c_0$ of the current state was fed back to a set of sign change blocks to change the sign of the incoming precomputed linear functional expressions of the digital sample value for the next state whenever the $c_0$ bit in a state register had a value of "1" corresponding to the negative state phase. By thus predetermining the correct phase (positive or negative) of the next state, one set of comparators could be used to perform the comparison step, thereby halving the number of comparators required. However, in a high-speed implementation, $c_0$ could not be computed quickly enough to change the sign of the precomputed linear functions before the comparison step.

There is a need for an improved (1,7) ML channel embodying a hardware implementation that significantly reduces circuitry and power requirements with no sacrifice in data rate. For disk storage products used in personal computers and laptop computers, power consumption in read/write electronics must be extremely constrained.

SUMMARY OF THE INVENTION

A decoder is described for use in a signal processing channel for processing digital sample values corresponding to an incoming read signal representative of coded binary data. The decoder advances from a current state to a next state by implementing a sequence detection algorithm iterated by successive clock cycles. Appropriate functional expressions of digital sample values are precomputed for a preselected number of sample values ahead of a current sample value.

Circuitry providing binary decision outputs includes comparators for comparing preselected ones of said functional expressions against binary representations of corresponding thresholds that are conditioned by the sign of a selected functional expression that includes at least one preselected digital sample value. These binary decision outputs, the sign of the selected functional expression, the current value ($d_0$) and previous value ($d_{-1}$) of decoded data, and the current value ($b_0$) of detected phase, are all used to determine the next value ($d_1$) of decoded data and next value ($b_1$) of detected phase. These next values become the current values of decoded data and detected phase for the next iteration of the clock cycle.

According to one embodiment, one set of inverters complements the binary representations that are input to the comparators only if the selected functional expression has a preselected sign, and another set of inverters inverts the binary decision outputs of the comparators only if the selected functional expression has the same preselected sign.

According to another embodiment, one set of multiplexers each input to a corresponding one of the comparators a threshold corresponding to another phase of the read signal according to whether the selected functional expression has one sign or another sign, respectively, and a set of inverters inverts the binary decision outputs of the comparators only if the selected functional expression has the another sign.

DESCRIPTION OF PREFERRED EMBODIMENT

Figure 1:
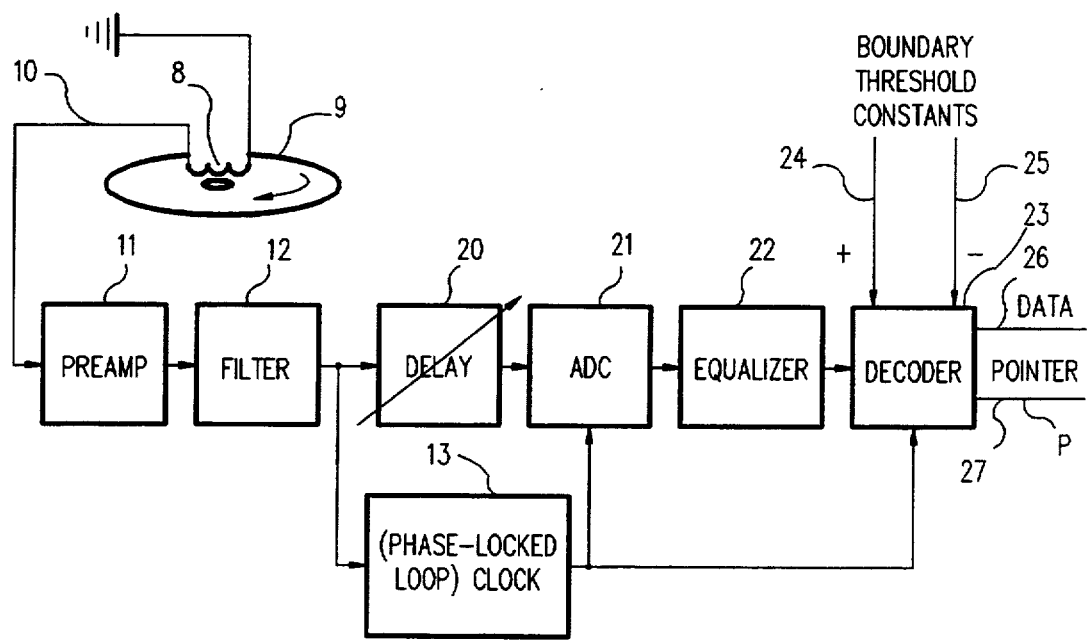
FIG. 1 is a schematic diagram of a coded digital signal processing channel, as known in the prior art.
Figure 2:
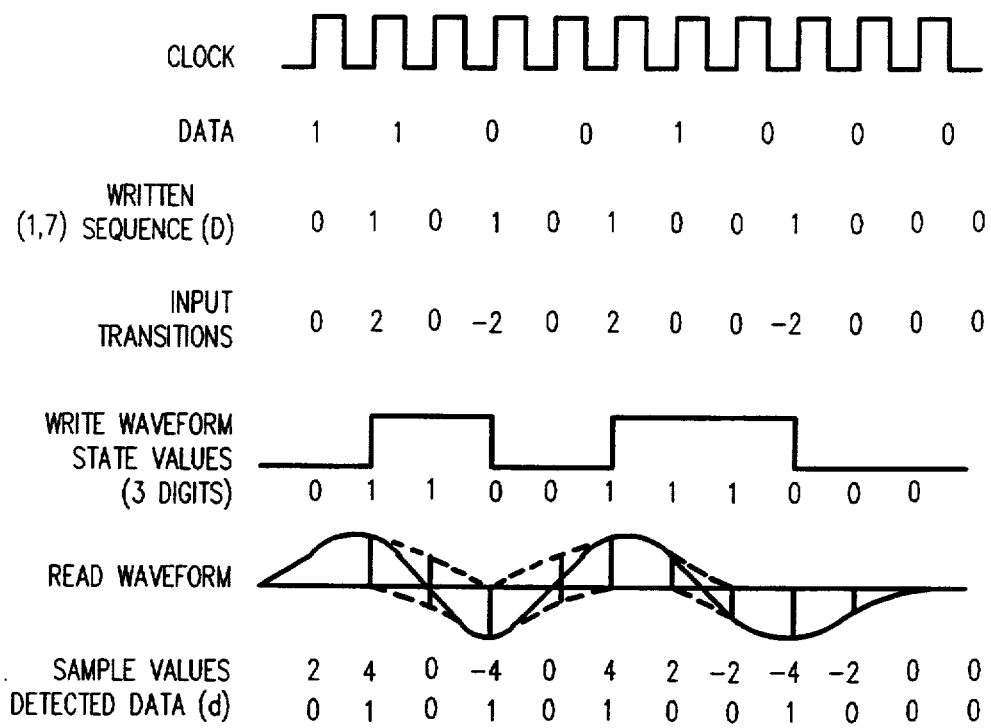
FIG. 2 depicts ideal write and read waveforms for (1,7) ML coded data and read sample values, as heretofore known.

Preliminary—FIGS. 1 and 2

FIG. 1 depicts, as known in the prior art, a coded digital signal processing channel, preferably an extended partial response maximum likelihood (EPRML) channel which is characterized by the polynomial $(1-D)(1+D)^2$. An analog signal is read by a transducer 8 from a magnetic recording medium, such as a disk 9, in a digital storage device. This read signal corresponds to a binary data sequence coded with the (1,7) run length limited (RLL) code during a write operation. The read signal passes from line 10 through a preamplifier 11 with automatic gain control (AGC) and a low bandpass filter 12. The output of filter 12 is supplied to a phase-locked clock 13 comprising a phase-locked loop timing recovery circuit including a variable frequency oscillator (VFO).

Filter 12 and equalizer 22 filter the read signal so that the response to a single magnetic transition is a pulse given by the sample values . . . , 0, 2, 4, 2, 0, . . . . This results in written transitions of magnitude 2 between $+1$ and $-1$ levels of magnetic saturation, and read response is normalized by a scaling factor to correspond thereto.

The coded analog read signal output from filter 12 is supplied to a delay means 20. Delay means 20 provides delay alignment between the analog signal and clock signal inputs to an analog-to-digital converter (ADC) 21. ADC 21 converts the analog input signal into digital sample $x$ values, such as $y_0 \ldots y_5$, at successive clock times, where $y_0$ corresponds to the current clock cycle. These digital sample values, optionally equalized by an equalizer 22, are then passed to a decoder 23. Positive and negative boundary threshold constants are applied via lines 24, 25, respectively, to decoder 23. Decoder 23 applies a decoupling algorithm to the digital sample values to provide a coded binary data output in line 26 and, where appropriate, a pointer flag in line 27, at successive clock times under control of clock 13.

FIG. 2 depicts the write and read waveforms and associated sequences of data and sample values clocked by clock 13 in a noise-free environment. As so depicted, the sample values range through the discrete set $\{-4, -2, 0, +2, +4\}$. Actual samples, however, as noted earlier, will not be exactly equal to the ideal patterns of the read signal because of signal anomalies due to non-linearity, misequalization, and/or pulse asymmetry, as well as additive noise, and thus will range through various noninteger values around the integers in the discrete set. In general, $y = x + e$ where is exactly equal to one of the ideal patterns, and e is the error in the received signal. The (1,7) ML decoding algorithm decides which of the ideal patterns is closest to the actual received pattern.

At any point in time, the (1,7) ML channel will be in one of six states: 000, 100, 111, 011, 001, or 110. States 100, 000, and 001 correspond to detection of a positive read pulse and have mirror image (i.e., $+/-$sign) symmetry with states 011, 111, and 110, respectively, that correspond to detection of a negative read pulse. The current state is determined by past decoding decisions, and the current decoding decision determines which state comes next. Two of these states (001 and 110) are transitional only as the decision is automatic because the (1,7) code constraint implies that state 001 must be followed by state 011 and similarly state 110 must be followed by state 100. At each of the remaining four states, based on the sampled read signal, the channel must make a ML decision regarding the next state.

In Reference 2, each decision of the (1,7) ML algorithm requires six linear functional expressions, $H_1$, $H_2$, $H_3$, $H_4$, $H_5$, $H_6$, of the sample values $y_0$, $y_1$, $y_2$, $y_3$, $y_4$, $y_5$, to be computed and $H_1$ $H_5$ are compared to six thresholds A, B, X, Y, Z and W as established by the boundary threshold constants.

Linear functions $H_1$ and $H_2$ are compared to the A and B boundaries to determine Boolean variables for a baseline check; the linear functional expressions $H_3$–$H_5$ are compared to the X, Y, Z and W boundaries to determine Boolean variables for a peak position check; and the linear functional expression $H_6$ is compared to the phase check boundary to determine a Boolean variable for a phase check. Note that $H_3$ is compared to two different boundary thresholds X and Y.

There are four sets of boundaries (corresponding to four decision-making states), each consisting of six boundary thresholds, resulting in a total of 24 boundary threshold constants. The set used for each ML decision depends on the current state. An error is associated with the value of at least one of the functional expressions $H_1$ falling on the wrong side of its boundary threshold.

Figure 3:
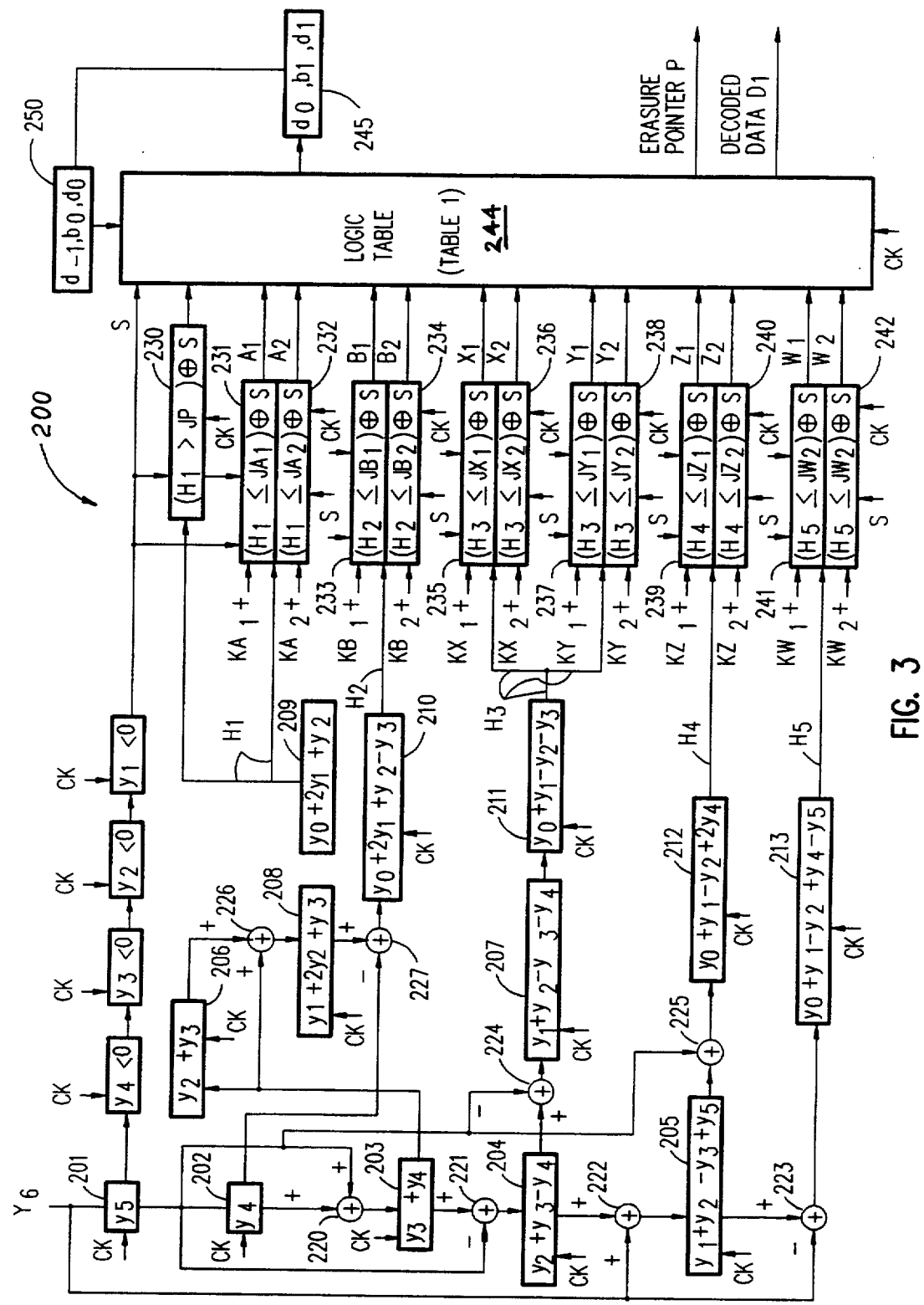
FIG. 3 constitutes a schematic diagram of a decoder apparatus embodying the invention showing specific pipelined data flow through adders and registers and comprising, in conjunction with a six-sample look-ahead, means for prejudging the current state of the coded digital signal processing channel of FIG. 1.
Figure 4:
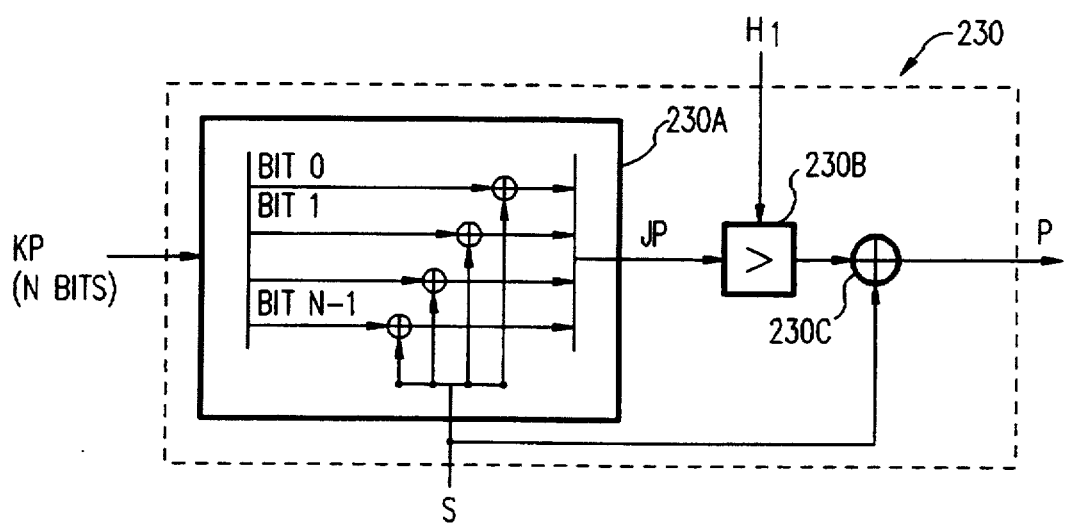
FIG. 4 shows details of one of the select/compare/invert circuits depicted in FIG. 3.
Figure 5:
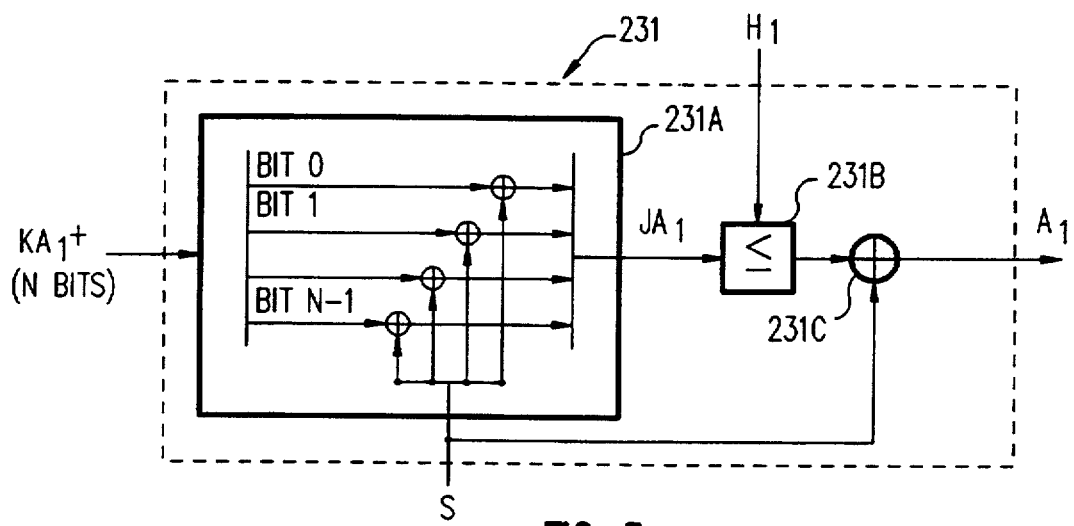
FIG. 5 shows details of the remaining select/compare/invert circuits depicted in FIG. 3.

Detailed Description—FIGS. 3–5

The following description will be limited to that considered necessary for an understanding of the present invention. For additional background description, the reader is referred to Reference 2.

As illustrated in FIG. 3, the apparatus embodying the invention comprises a decoder 200 which replaces the prior art decoder 23 depicted in FIG. 1 and constitutes an improvement over the decoders disclosed in Reference 1-3.

According to the invention, and as hereinafter more fully described, apparatus is provided for prejudging, prior to calculation of a current state of the signal processing channel, which of two state groups the current state will be in. This enables certain hardware to be reduced 50% and thus provide significant savings in power and hardware cost without sacrificing data rate.

As shown in FIG. 3, and as described in Reference 2, registers 201-213 hold the respective interim linear functions of the digital sample values $y_0$ through $y_5$. During each clock cycle CK, the content of each register 201-213 is moved in the direction of the arrow to the next register as appropriate functions are created through eight adder circuits 220-227.

In accordance with the invention, the sign of digital sample value $y_1$, which is available due to the pipelined nature of decoder 200, is used in a feed forward manner to prejudge or pre-estimate the phase of the current state ($a_0$, $b_0$, $c_0$) of the channel.

Let $S=1$ if the sign of $y_1$ is negative (i.e., $y_1$ is $<0$), and $S=0$ if the sign of $y_1$ is positive (i.e., $y_1$ is $\geq 0$). Then the current state ($a_0$, $b_0$, $c_0$) of the channel will be prejudged as either 000 or 100 , if $S=0$, and as either 111 or 011, if $S=1$.

This constitutes a state-phase prejudgment or pre-estimate since the positive phase states 000 and 100 are separated from the negative phase states 111 and 011. This state-phase prejudgment is very effective when the value of $y_1$ is substantially positive or negative. However, when the value of $y_1$ is near 0, the noise in $y_1$ may result in an erroneous prediction of the corresponding phase. According to a feature of the invention, such an error is avoided in the output logic by interlocking the final decision with the correct state value, in the manner presently to be described.

The binary value of S, which is based upon the sign of sample value $y_1$, thus represents the prejudged current state of the channel. S is input concurrently to a set of select/compare/inverter circuits 230-242 and to a logic block 244. As illustrated, the select/compare/inverter circuits 230-242 are thus conditioned by the sign of the digital sample value $y_1$.

As illustrated in FIG. 4, select/compare/invert circuit 230 comprises a select circuit 230a, a comparator 230b, and an exclusive OR (XOR) 230c constituting an inverter. Select circuit 230a takes input KP, and outputs as JP either KP or its complement according to whether $S=0$ or $S=1$, respectively. If functional expression $H_1 > JP$, comparator 230b outputs a "1" to XOR 230c, or otherwise outputs a "0". XOR 230c inverts the comparator output if $S=1$, but not if $S=0$, thereby to provide a binary decision output p, which is used for a phase check. Note that the functional expression $H_1$ is now used (instead of the functional expression $H_6$ as heretofore) for the phase check as well as for the baseline check. This is possible because $d_1$ is detected instead of $d_0$, $d_1$ being one cycle later than $d_0$.

Except for the differing inputs and outputs shown in FIG. 3, each select/compare/invert circuit 232-242 is identical with the circuit 231 which is shown in detail in FIG. 5. As illustrated, circuit 231 comprises a select circuit 231a, a comparator 231b, and an inverter 231c in the form of an exclusive OR (XOR) circuit.

Select circuit 231a comprises a set of XORs which are conditioned by the phase prejudgment variable S determined by the sign of incoming digital sample value $y_1$ and convert the n-bit positive phase value $KA_1{}^+$ to an output $JA_1$. IF $S=0$, $JA_1 = KA_1{}^+$; whereas if $S=1$, then $JA_1 = C[KA_1{}^+]$, which denotes the complement of $KA_1{}^+$. I[comparator 231b determines that the functional expression $H_1 \leq JA_1$, then it outputs a "1", whereas, if $H_1 > JA_1$, then it outputs a "0". The output of comparator 231b is fed to the XOR circuit 231c, which is conditioned by the phase prejudgment variable S, to invert the comparator output if $S=1$ or not invert it if $S=0$, to provide the binary decision output $A_1$.

In a similar manner, the other select/compare/invert circuits 232-242, as illustrated, have as inputs $KA_2{}^+ - KW_2{}^+$, respectively, as well as the appropriate linear functional expressions $H_1$-$H_5$ and the logical variable S. These circuits 232-242 compare preselected ones of the functional expressions $H_1$-$H_5$ of the digital sample value $y_1$ to provide respective binary decision outputs $A_2$, $B_1$, $B_2$, $X_1$, $X_2$, $Y_1$, $Y_2$, $Z_1$, $Z_2$, $W_1$, $W_2$ to logic block 244.

Block 244 implements the logic shown below in Table 1. Table 1 specifies the intermediate and output logic according to the invention. In Table 1, $R_1$ and $R_2$ denote decision variables obtained from the peak position check and baseline check; P denotes the erasure pointer; $b_0$ and $d_0$ denote the current values of detected phase and decoded data, respectively, whereas $b_1$ and $d_1$ denote the values of detected phase and decoded data for the next state after the current state. The values $d_0$, $b_1$, $d_1$ for the next state, as computed by the logic of Table 1, are stored in a state register 245.

TABLE 1

Intermediate Logic and Output Logic

Intermediate Logic
$R_1 = A_1 B_1 + X_1 + Y_1 Z_1 W_1$
$R_2 = A_2 B_2 + X_2 + Y_2 Z_2 W_2$
$P_0 = p\overline{S}d_{-1}$
$P_1 = p\overline{S}d_{-1}$ Erasure Pointer
$P = P_0 \overline{d_0} b_0 + P_1 \overline{d_0} b_0$ Output Logic - Decoded Data ($d_1$) and Next State {$d_0$, $b_1$, $d_1$}
$b_1 = P_0 b_0 \overline{d_0} + \overline{P_1} b_0 d_0 + \overline{b_0} d_0$
$d_1 = [R_1 d_{-1} \overline{d_0} + R_2 \overline{d}_{-1} d_0][Sb_0 + \overline{S}\overline{b_0} + p\overline{d}]$ The expression for $d_1$ consists of two terms. The first term, $[d_0 R_1 d_{-1} + \overline{d_0} R_2 d_{-1}]$, will give the correct bit decision if the prejudged state S was correct. The second term, $[Sb_0 + \overline{S}\overline{b_0} + pd_{-1}]$, serves to verify that the prejudged phase was in fact correct. This second term will be "1" if the current state agrees with the prejudged state because in that case $S = b_0$ and $[Sb_0 + \overline{S}\overline{b_0}] = 1$. It will also be "1" if $pd_{-1} = 1$, even if the current state disagrees with the prejudged state because the phase check of the (1,7) ML channel overrides the current state value if a large pulse of 'wrong' polarity is observed. This acts to return the channel to the correct phase, without making a new error, when the channel is in the wrong phase due to a prior missing or extra bit. By combining these two terms, correct decisions will always result, even when the prejudged phase S is incorrect.

In Reference 2, four terms were computed, one for each functional expression, corresponding to a respective one of the four possible states. For example, for the expression $y_0 + 2y_1 + y_2$, the following were computed:

$$A_1{}^+ = y_0 + 2y_1 + y_2 \leq KA_1{}^+$$

$$A_1{}^- = -[y_0 + 2y_1 + y_2] \leq KA_1{}^-$$

$$A_2{}^+ = y_0 + 2y_1 + y_2 \leq KA_2{}^+$$

$$A_2{}^- = -[y_0 + 2y_1 + y_2] KA_2{}^-$$

By contrast, according to the invention, the phase of the current state is prejudged, enabling elimination of half of these comparisons. Thus, if $S=0$, it is only necessary to compute:

$$A_1{}^+ = y_0 + 2y_1 + y_2 \leq KA_1{}^+ \qquad (1)$$

$$A_2{}^+ = y_0 + 2y_1 + y_2 \leq KA_2{}^+ \qquad (2)$$

while, if $S=1$, compute:

$$A_1{}^- = -[y_0 + 2y_1 + y_2] \leq KA_1{}^- \qquad (3)$$

$$A_2{}^- = -[y_0 + 2y_1 + y_2] \leq KA_2{}^- \qquad (4)$$

In Table 1, the single term $y_1$ replaces the terms $A_1{}^+$ and $A_1{}^-$ heretofore used, and similar substitutions are made for all other terms. This results in considerable reduction in the logic equations, which is in addition to the significant reduction which comes about by using only half the number of comparators heretofore used.

According to another feature of the invention, the logic reduction in Table 1 is achieved by a new state-representation for the decoding process, which is completely isomorphic to that heretofore used, but which facilitates simplification of the hardware in decoder 200.

Instead of representing the channel state at any point in time by the three most recent bits ($a_0$, $b_0$, $c_0$) for the NRZ representation of the (1,7) coded data sequence, an equivalent but more efficient NRZI state representation ($d_{-1}$, $b_0$, $d_1$) is used, determined as follows.

Since the sequence {d} of decoded bits is related to the state sequence by the equation $$d_0 = \overline{b_0}c_0 + \overline{b_0}c_0,$$

and also $$a_0 = b_{-1}, b_0 = c_{-1},$$

it is possible to compute:

$$d_{-1} = b_0\overline{a_0} + \overline{b_0}a_0$$

$$c_0 = b_0\overline{d_0} + \overline{b_0}d_0$$

$$a_0 = b_0\overline{d}_{-1} + \overline{b_0}d_{-1}$$

Using these equations, the ($a_0$, $b_0$, $c_0$) state representation is replaced with the equivalent representation based on slates of the form ($d_{-1}$, $b_0$, $d_0$), which are stored in a state register 250 and enumerated in Table 2.

TABLE 2

State Equivalence Table

| Prior Art | | | Present Invention | | | |
|---|---|---|---|---|---|---|
| | | | State | | | |
| $a_0$ | $b_0$ | $c_0$ | $d_{-1}$ | $b_0$ | $d_0$ | Phase |
| 1 | 0 | 0 | 1 | 0 | 0 | Positive |
| 0 | 0 | 0 | 0 | 0 | 0 | Positive |
| 0 | 0 | 1 | 0 | 0 | 1 | Positive |
| 0 | 1 | 1 | 1 | 1 | 0 | Negative |
| 1 | 1 | 1 | 0 | 1 | 0 | Negative |
| 1 | 1 | 0 | 0 | 1 | 1 | Negative |

This form of representation has at least two advantages. By eliminating the step of computing $c_0$ prior to computing $d_0$, the logic equations are simplified (saving circuits and power). Also, the decoded bit is made available one cycle earlier, thus reducing latency and hence the gap timing requirements.

According to an important feature of the invention, negative phase comparisons have been achieved by inversion of the boundary threshold values. More specifically, equations (1)–(4) above involve four different boundary threshold constants which heretofore had to be stored in registers, even though only two of these constants were used at each step in the detection process: e.g., $KA_1^+$ and $KA_2^+$ in the positive phase, or $KA_1^-$ and $KA_2^-$ in the negative phase. In the case of a symmetric readback pulse, as assumed for the select-/compare/invert circuit 231 of FIG. 5, each boundary threshold value is set equal to the negative of the boundary value of the opposite phase state. For example, $$KA_2^+ = KA_2^- \qquad (5)$$

$$KA_1^+ = KA_1^- \qquad (6)$$

Thus, half of the boundary value registers can be eliminated by storing only the positive phase values, $KA_2^+$, $KA_1^+$, etc., and computing the negative phase values, $KA_2^-$, $KA_1^-$, etc., as needed. Now, if numbers are represented using two's-complement arithmetic, negating the positive boundary values, as in equations (5) and (6), can be avoided because, in two's-complement arithmetic, for any N:

$$-N = C[N] + 1$$

where the complement C[N] of a number is obtained by simply inverting all bits in the binary representation of that number. This enables equation (3) to be implemented as follows:

$$\begin{aligned}
A_1^- &= -[y_0 + 2y_1 + y_2] \leq KA_1 \\
&= [y_0 + 2y_1 + y_2] \geq -KA_1^- = C[KA_1^+] + 1 \\
&= [y_0 + 2y_1 + y_2] > C[KA_1^+] \\
&= C[[y_0 + 2y_1 + y_2] \leq C[KA_1^+]]
\end{aligned}$$

So for negative phase states (i.e., when S=1), the required output values of comparator 231b can be computed by using in the comparator the complement of the positive phase boundary and inverting the output of the comparator.

This enables use of identical boundary threshold values for complementary states without storing both values separately, and it produces the required comparator values by simple complementation, saving time over negating the boundary values directly.

The circuit 231, as specifically illustrated in FIG. 5, is adequate and hence preferable as a means of computing $A_1$ if $KA_1^+ = KA_1^-$. However, unless $KA_1^+ = KA_1^-$, each circuit 232–242 is preferably replaced with the alternative select/compare/invert circuit 331 illustrated in FIG. 6, wherein $C[KA_1^-]$ is the complement of the binary representation of $KA_1^-$.

Figure 6:
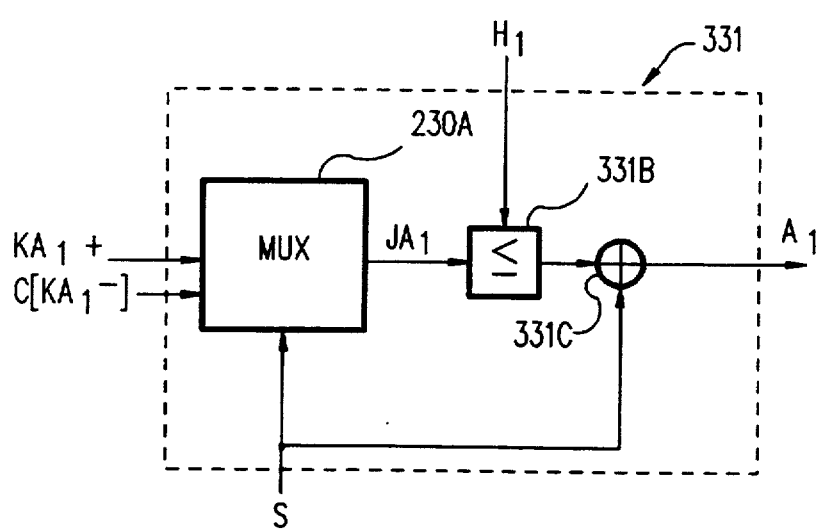
FIG. 6 shows an alternative circuit for performing the select/compare/invert functions of the circuits depicted in FIG. 5.

Detailed Description—FIG. 6

According to this variation, circuit 331 comprises a multiplexor (MUX) 331a which receives as input not only $KA_1^+$ but also $C[KA_1^-]$. The variable S conditions MUX 331a to select and output $JA_1 = KA_1^+$ if S=0, or $JA_1 = C[KA_1^-]$ if S=1. Thus, each multiplexer 331a inputs to a corresponding one of the comparators 331b a threshold corresponding to one phase of the read signal or a complement of a threshold corresponding to another phase of the read signal according to whether the selected functional expression (here, $y_1$ and hence the phase prejudgment variable S has one sign (S=0) or another sign (S=1), respectively. As with FIG. 5, the linear functional expression $H_1$ is compared at 331b with $JA_1$. If $H_1 \leq JA_1$, then comparator 331b outputs a "1"; whereas if $H_1 > JA_1$, then comparator 331b outputs a "0". XOR 331c receives the output of comparator 331b and inverts it only if S=1. The output of XOR 331c constitutes the binary decision output $A_1$, as illustrated. As in the embodiment of FIGS. 3 and 5, the logic circuitry of Table 1 is conditioned by the phase S of the preselected digital sample value (here $y_1$) in conjunction with the current value ($d_0$) and previous ($d_{-1}$) value of the decoded data and current value ($b_0$) of detected phase for determining the next values of decoded data and detected phase, which then become the current values for the next iteration of the clock cycle.

Note that in the circuit 230 of FIG. 4, a MUX (like 331a) would replace the select circuit 230a. This MUX would be conditioned by the variable S to select and output JP=KP if S=0 or JP=C[KP$^-$] if =1. A comparator (like 331b) would output a "1" if $H_1 > JP$ or otherwise a "0", and this output would be inverted by an XOR (like 331c) only if S=1.

In the embodiments above described, the sign of the preselected digital sample value $y_1$ (the sample value next to the current sample value $y_0$) was used to prejudge the phase of the read signal. However, if preferred, it will be understood that the sign of a selected functional expression (such as $y_0+2y_1+y_2$) that contains at least one digital sample value may be used to prejudge the phase of the read signal.

While the invention has been shown and described with respect to preferred embodiments thereof, it will be understood by those skilled in the art that changes in form and detail may be made in these embodiments without departing from the scope and teaching of the invention. Accordingly, the apparatus and method herein disclosed is to be considered merely as illustrative, and the invention is to be limited only as specified in the claims.

We claim:

1. For use in a signal processing channel for processing digital sample values corresponding to an incoming read signal representative of coded binary data, a decoder apparatus implemented in accordance with a sequence detection algorithm iterated by successive clock cycles for advancing from a current state to a next state, said decoder apparatus comprising:

circuitry for precomputing values of appropriate functional expressions for a preselected number of digital sample values ahead of a current digital sample value;

means for providing binary decision outputs, including comparators for comparing preselected ones of said values of functional expressions against binary representations of corresponding thresholds conditioned by the sign of the value of a selected functional expression comprising at least one digital sample value; and circuitry for determining, from (i) said binary decision outputs, (ii) sign of the selected functional expression value, (iii) current value and previous value of decoded data, and (iv) current value of detected phase, next values of decoded data and detected phase, which then become current values for the next iteration of the clock cycle.

2. The apparatus of claim 1, wherein said means includes inverters for complementing said binary representations input to the comparators only if said selected functional expression value has a preselected sign; and inverters for inverting said binary decision outputs of said comparators only if said selected functional expression value has said preselected sign.

3. The apparatus of claim 1, wherein said means includes a set of multiplexers, each for inputting to corresponding ones of the comparators a threshold corresponding to one phase of the read signal or a complement of a threshold corresponding to another phase of the read signal according to whether said selected functional expression value has one sign or another sign, respectively; and a set of inverters for inverting the binary decision outputs of said comparators only if said selected functional expression value has said another sign.

4. The apparatus of claim 3, wherein said one phase and another phase are a positive phase and a negative phase, respectively.

5. For use in a signal processing channel for processing digital sample values corresponding to an incoming read signal representative of coded binary data, a decoder apparatus implemented in accordance with a sequence detection algorithm iterated by successive clock cycles for advancing from a current state to a next state, said decoder apparatus comprising:

circuitry for precomputing values of appropriate functional expressions for a preselected number of digital sample values ahead of a current digital sample value;

a set of circuits, each to provide a binary decision output, each circuit including (i) a comparator for comparing a respective value of one of said functional expressions against a binary representation of a corresponding boundary threshold conditioned by the sign of the value of a selected functional expression comprising at least one preselected digital sample value, (ii) means for complementing the binary representation input to the respective comparator only if the selected functional expression value has a preselected sign, and (iii) means for inverting the binary decision output only if said selected functional expression value has said preselected sign; and circuitry for determining, from (i) all of said binary decision outputs, (ii) sign of the selected functional expression value, (iii) current value and previous value of decoded data, and (iv) current value of detected phase, next values of decoded data and detected phase, which then become current values for the next iteration of the clock cycle.

6. In a signal processing channel for processing digital sample values corresponding to an incoming read signal representative of coded binary data, a decoder apparatus implemented in accordance with a sequence detection algorithm, the combination of:

clocking means to provide successive clock cycles for advancing the decoder apparatus from a current state to a next state; and a decoder comprising:

circuitry for precomputing values of appropriate functional expressions for a preselected number of digital sample values ahead of a current digital sample value:

means for providing binary decision outputs including comparators for comparing preselected ones of said values of functional expressions against binary representations of corresponding thresholds conditioned by the sign of the value of selected functional expression comprising at least one digital sample value; and circuitry for determining, from (i) said binary decision outputs, (ii) sign of the selected functional expression value, (iii) current value and previous value of decoded data, and (iv) current value of detected phase, next values of decoded data and detected phase, which then become current values for the next iteration of the clock cycle.

7. The apparatus of claim 6, wherein said means includes inverters for complementing said binary representations input to the comparators only if said selected functional expression value has a preselected sign; and inverters for inverting said binary decision outputs of said comparators only if said selected functional expression value has said preselected sign.

8. The apparatus of claim 6, wherein said means includes
- a set of multiplexers, each for inputting to corresponding ones of the comparators a threshold corresponding to one phase of the read signal or a complement of a threshold corresponding to another phase of the read signal according to whether said selected functional expression value has one sign or another sign, respectively; and
- a set of inverters for inverting the binary decision outputs of said comparators only if said selected functional value expression has said another sign.

9. In a signal processing channel for processing digital sample values corresponding to an incoming read signal representative of coded binary data, a decoder apparatus implemented in accordance with a sequence detection algorithm, the combination of:
- clocking means to provide successive clock cycles for advancing the decoder apparatus from a current state to a next state; and
- a decoder comprising:
  - circuitry for precomputing values of appropriate functional expressions for a preselected number of digital sample values ahead of a current digital sample value;
  - a set of circuits, each to provide a binary decision output, each circuit including (i) a comparator for comparing a respective value of one of said functional expressions against a binary representation of a corresponding boundary threshold conditioned by the sign of the value of a selected functional expression comprising at least one preselected digital sample value, (ii) means for complementing the binary representation input to the respective comparator only if the selected functional expression value has a preselected sign, and (iii) means for inverting the binary decision output only if said selected functional expression value has said preselected sign; and
  - circuitry for determining, from (i) all of said binary decision outputs, (ii) sign of the selected functional expression value, (iii) current value and previous value of decoded data, and (iv) current value of detected phase, next values of decoded data and detected phase, which then become current values for the next iteration of the clock cycle.

10. In a signal processing channel for processing digital sample values corresponding to an incoming read signal representative of coded binary data, a decoding method implemented in accordance with a sequence detection algorithm and comprising the steps of:
- providing successive clock cycles for advancing from a current state to a next state;
- precomputing values of appropriate functional expressions for a preselected number of digital sample values ahead of a current digital sample value;
- providing binary decision outputs by comparing preselected ones of said values of functional expressions against binary representations of corresponding thresholds conditioned by the sign of the value of a selected functional expression that includes at least one preselected digital sample value; and
- determining, from (i) said binary decision outputs, (ii) sign of the selected functional expression value, (iii) current value and previous value of decoded data, and (iv) current value of detected phase, next values of decoded data and detected phase, which then become current values for the next iteration of the clock cycle.

11. A data storage system comprising:
storage means;
a signal processing channel for processing digital sample values corresponding to an incoming read signal from the storage means representative of coded binary data;
a system clock; and
a decoder implemented in accordance with a sequence detection algorithm iterated by successive clock cycles of the clock for advancing from a current state to a next state, said decoder apparatus comprising:
- circuitry for precomputing values of appropriate functional expressions for a preselected number of digital sample values ahead of a current digital sample value;
- means for providing binary decision outputs, including comparators for comparing preselected ones of said values of functional expressions against binary representations of corresponding thresholds conditioned by the sign of the value of a selected functional expression comprising at least one digital sample value; and
- circuitry for determining, from (i) said binary decision outputs, (ii) sign of the selected functional expression value, (iii) current value and previous value of decoded data, and (iv) current value of detected phase, next values of decoded data and detected phase, which then become current values for the next iteration of the clock cycle.

* * * * *

UNITED STATES PATENT AND TRADEMARK OFFICE
CERTIFICATE OF CORRECTION

PATENT NO. : 5,430,745
DATED : July 4, 1995
INVENTOR(S) : Patel et al.

It is certified that error appears in the above-indentified patent and that said Letters Patent is hereby corrected as shown below:

Column 6, line 16, delete equation, insert- $[\overline{d_0 R_1} d_{-1} + \overline{d_0 R_2 d_{-1}}]$ -.

Column 6, line 18, delete equation, insert- $[Sb_o + \overline{Sb_o} + p\overline{d}_{-1}]$ -.

Column 6, line 22, delete equation, insert- $[Sb_0 + \overline{Sb_0}] = 1$. -.

Signed and Sealed this

Twenty-fourth Day of October, 1995

Attest:

BRUCE LEHMAN

*Attesting Officer*    Commissioner of Patents and Trademarks